United States Patent
Oteri et al.

(10) Patent No.: US 11,894,444 B2
(45) Date of Patent: Feb. 6, 2024

(54) SECURE CHIP IDENTIFICATION USING RANDOM THRESHOLD VOLTAGE VARIATION IN A FIELD EFFECT TRANSISTOR STRUCTURE AS A PHYSICALLY UNCLONABLE FUNCTION

(71) Applicant: INTERNATIONAL BUSINESS MACHINES CORPORATION, Armonk, NY (US)

(72) Inventors: Clint Jason Oteri, East Greenbush, NY (US); Alexander Reznicek, Troy, NY (US); Bahman Hekmatshoartabari, White Plains, NY (US); Jingyun Zhang, Albany, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/062,488

(22) Filed: Dec. 6, 2022

(65) Prior Publication Data
US 2023/0109345 A1     Apr. 6, 2023

Related U.S. Application Data

(63) Continuation of application No. 17/094,848, filed on Nov. 11, 2020, now Pat. No. 11,575,023.

(51) Int. Cl.
*H01L 29/00* (2006.01)
*H01L 29/66* (2006.01)
*H01L 29/423* (2006.01)

(52) U.S. Cl.
CPC .. *H01L 29/66545* (2013.01); *H01L 29/42364* (2013.01); *H01L 29/6653* (2013.01); *H01L 29/66515* (2013.01); *H01L 29/66553* (2013.01)

(58) Field of Classification Search
CPC ............ H01L 23/544; H01L 29/42364; H01L 29/778
See application file for complete search history.

(56) References Cited

U.S. PATENT DOCUMENTS

| 7,757,083 B2 | 7/2010 | Devadas |
| 8,028,924 B2 | 10/2011 | Anderson |

(Continued)

FOREIGN PATENT DOCUMENTS

| CN | 102460681 A | 5/2012 |
| CN | 102593180 A | 7/2012 |

(Continued)

OTHER PUBLICATIONS

IBM, List of IBM Patents or Patent Applications Treated as Related, Appendix P, dated Dec. 9, 2022, 2 pages.

(Continued)

*Primary Examiner* — Reema Patel
(74) *Attorney, Agent, or Firm* — Douglas M. Crockatt

(57) ABSTRACT

A semiconductor structure may include one or more metal gates, one or more channels below the one or more metal gates, a gate dielectric layer separating the one or more metal gates from the one or more channels, and a high-k material embedded in the gate dielectric layer. Both the high-k material and the gate dielectric layer may be in direct contact with the one or more channels. The high-k material may provide threshold voltage variation in the one or more metal gates. The high-k material is a first high-k material or a second high-k material. The semiconductor structure may only include the first high-k material embedded in the gate dielectric layer. The semiconductor structure may only include the second high-k material embedded in the gate dielectric layer. The semiconductor structure may include both the first high-k material and the second high-k material embedded in the gate dielectric layer.

9 Claims, 9 Drawing Sheets

(56) References Cited

U.S. PATENT DOCUMENTS

| | | | |
|---|---|---|---|
| 8,522,065 | B2 | 8/2013 | Regev |
| 8,525,289 | B2 | 9/2013 | Carter |
| 8,619,979 | B2 | 12/2013 | Ficke |
| 8,741,713 | B2 | 6/2014 | Bruley |
| 8,938,069 | B2 | 1/2015 | Orshansky |
| 9,269,635 | B2 | 2/2016 | Li |
| 9,391,030 | B1 | 7/2016 | Li |
| 2009/0194791 | A1 | 8/2009 | Kanamura |
| 2010/0289089 | A1 | 11/2010 | Carter |
| 2012/0100684 | A1 | 4/2012 | Min |
| 2013/0241004 | A1 | 9/2013 | Yin |
| 2016/0079066 | A1* | 3/2016 | Takada .......... H01L 29/452 438/586 |
| 2016/0314319 | A1 | 10/2016 | Choi |

FOREIGN PATENT DOCUMENTS

| | | |
|---|---|---|
| CN | 107078162 A | 8/2017 |
| JP | 2006210636 A | 8/2006 |

OTHER PUBLICATIONS

Pending U.S. Appl. No. 17/094,848, filed Nov. 11, 2020, entitled "Secure Chip Identification Using Random Threshold Voltage Variation in a Field Effect Transistor Structure as a Physically Unclonable Function", 28 pages.

International Search Report and Written Opinion of the International Searching Authority, International Application No. PCT/CN2021/127950, dated Jan. 29, 2022, 9 pgs.

Kalyanaraman et al., "Novel strong PUF based on Nonlinearity of MOSFET Subthreshold Operation", © 2013 IEEE, 2013 IEEE International Symposium on Hardware-Oriented Security and Trust (HOST), pp. 13-18.

Simpson, "Three Technologies U.S. Defense Agencies Are Using to Battle Counterfeit Chips", SourceToday, Apr. 4, 2017, pp. 1-6.

* cited by examiner

SECURE CHIP IDENTIFICATION USING RANDOM THRESHOLD VOLTAGE VARIATION IN A FIELD EFFECT TRANSISTOR STRUCTURE AS A PHYSICALLY UNCLONABLE FUNCTION

BACKGROUND

The present invention relates generally to a semiconductor structure and a method of forming the same. More particularly, the present invention relates to secure chip identification using random threshold voltage ($V_{th}$) variation in a field effect transistor (FET) structure as a physically unclonable function (PUF).

A PUF is a physically-defined "digital fingerprint" that serves as a unique identity for a semiconductor device, such as, for example, a microprocessor. The PUF is a physical entity embodied in a physical structure. The PUF is based on a unique physical variation which may occur naturally during semiconductor manufacturing. The PUF may be implemented in an integrated circuit. The PUF may also be sued in applications with high security requirements, such as, for example, cryptography.

SUMMARY

According to one embodiment of the present invention, a semiconductor structure is provided. The semiconductor structure may include one or more metal gates, one or more channels below the one or more metal gates, a gate dielectric layer separating the one or more metal gates from the one or more channels, and a high-k material embedded in the gate dielectric layer. Both the high-k material and the gate dielectric layer may be in direct contact with the one or more channels. The high-k material may provide threshold voltage variation in the one or more metal gates. The high-k material is a first high-k material or a second high-k material. The semiconductor structure may include only the first high-k material embedded in the gate dielectric layer. The semiconductor structure may include only the second high-k material embedded in the gate dielectric layer. The semiconductor structure may include both the first high-k material and the second high-k material embedded in the gate dielectric layer.

According to another embodiment of the present invention, a semiconductor structure is provided. The semiconductor structure may include one or more gate regions of one or more field effect transistors. The one or more gate regions may be above one or more channels. The semiconductor structure may include a metal gate separated from the one or more channels by a gate dielectric layer, a high-k material embedded in the gate dielectric layer, and an interlayer dielectric. Both the high-k material and the gate dielectric layer may be in direct contact with the one or more channels. The interlayer dielectric may surround the one or more gate regions. The high-k material may be a first high-k material or a second high-k material. The semiconductor structure may include only the first high-k material embedded in the gate dielectric layer. The semiconductor structure may include only the second high-k material embedded in the gate dielectric layer. The semiconductor structure may include both the first high-k material and the second high-k material embedded in the gate dielectric layer. The high-k material may provide a threshold voltage variation in the one or more metal gates.

According to another embodiment of the present invention, a method is provided. The method may include forming one or more gate regions above a channel, randomly nucleating a high-k material in the one or more gate regions, and depositing a gate dielectric layer in each of the one or more gate regions. Randomly nucleating the high-k material in the one or more gate regions may facilitate a random threshold voltage within the one or more gate regions. The random threshold voltage within the one or more gate regions may be used as a physically unclonable function. The one or more gate regions may be surrounded by a gate spacer. The gate dielectric layer may cover the entire surface of the channel. The second high-k material may partially cover the surface of the channel. The high-k material may be a first high-k material or a second high-k material. The method may include embedding only the first high-k material in the gate dielectric layer. The method may include embedding only the second high-k material in the gate dielectric layer. The method may include embedding both the first high-k material and the second high-k material in the gate dielectric layer. The method may include forming a first source drain and a second source drain, depositing a metal gate on top of the gate dielectric layer, depositing an interlayer dielectric around the one or more gate regions, and forming a first source drain contact and a second source drain contact. The first source drain and the second source drains may be separated from the one or more gate regions by the gate spacer. The interlayer dielectric may be on top of the first source drain and the second source drain.

BRIEF DESCRIPTION OF THE DRAWINGS

The following detailed description, given by way of example and not intend to limit the invention solely thereto, will best be appreciated in conjunction with the accompanying drawings, in which.

Figure 1:
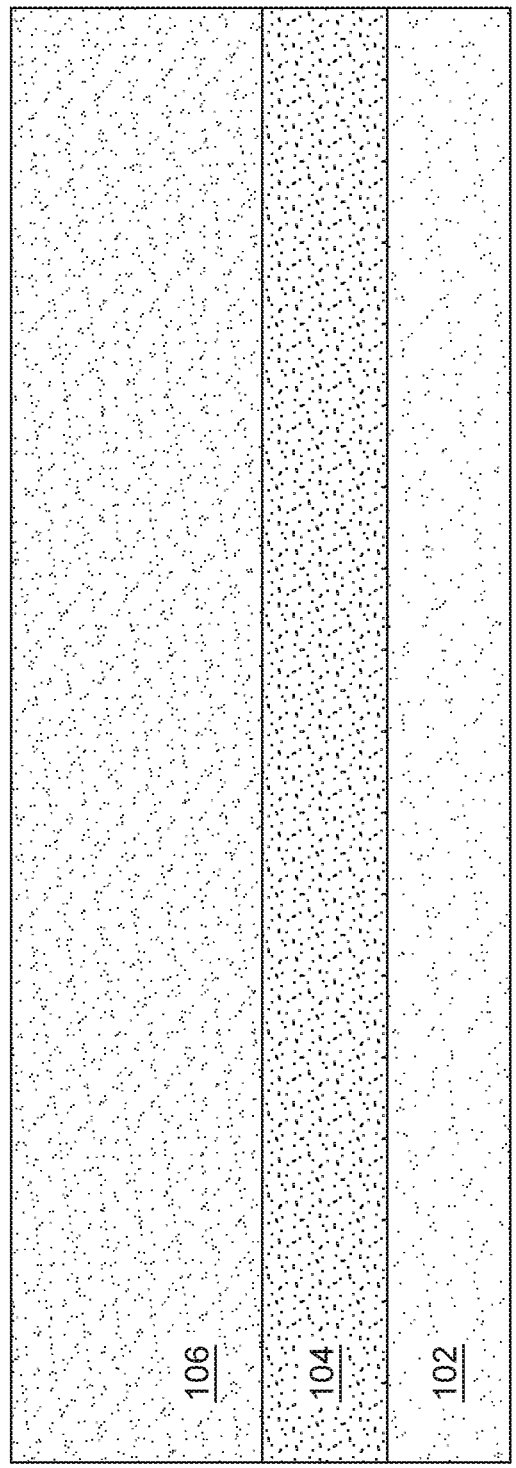
FIG. 1 is a cross section view illustrating a fin and a buried oxide arranged on a substrate according to an exemplary embodiment.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiment set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to a semiconductor structure and a method of forming the same. More particularly, the present invention relates to secure chip identification using random threshold voltage ($V_{th}$) variation in a field effect transistor (FET) structure as a physically unclonable function (PUF).

Semiconductor supply chain integrity is a vital security need, particularly for national defense. The loss of trusted foundries in the US has underscored the need to verify that chips installed in critical systems are authentic. For example, phony components, if substituted for real ones, can contain malicious circuitry enabling loss of functionality or snooping. As a result, there exists a need to fabricate a semiconductor device that may be identified as secure.

Many semiconductor devices use PUFs as a security measure. A PUF is a physically-defined "digital fingerprint" that serves as a unique identity for a semiconductor device, such as, for example, a microprocessor. The PUF is a physical object that for a given input and conditions (challenge), may provide a physically-defined "digital fingerprint" output (response) that serves as a unique identifier. The PUF is based on a unique physical variation which may occur naturally during semiconductor manufacturing. The PUF may be implemented in an integrated circuit. The PUF may also be used in applications with high security requirements, such as, for example, cryptography.

Silicon PUFs are increasingly used as a hardware root of trust and an entropy source for cryptography applications. In those applications, the reliability of a PUF output is key to a successful implementation. Both weak and strong PUFs obtain output by amplifying analog signals from physical properties on integrated circuit blocks. The analog signal may be a propagation delay, a ring oscillator, a time-controlled oxide breakdown, or a $V_{th}$ of SRAM transistor. These physical measurements are by nature sensitive to environmental conditions, such as, for example, temperature, operating voltage, thermal/interface noise of transistors, process corners, and aging. As a result, it is difficult to obtain a stable PUF output without taking additional stabilization and error-correction techniques, such as, for example, temporal majority voting (TMV), pre-burning on PUF bits for end-of-life (EOL) prediction and reliability screening, masking algorithms, as well as leveraging parity bits for an Error-Correcting-Code (ECC). As a result, there exists a need to fabricate a semiconductor device with a stable PUF output.

Embodiments of the present invention provide a structure and a method to form a random $V_{th}$ variation in a gate structure of a FET. The FET may be a planar FET, a nanosheet FET, a vertical FET, a nanowire FET, a fin FET, or any other FET or semiconductor device having a gate structure. The random $V_{th}$ is used as the PUF and is accomplished by different high-k materials randomly deposited in multiple gate regions of the device. FIGS. 1-8 illustrate a method of making a FET structure with a random $V_{th}$ variation as the PUF. FIG. 9 illustrates top cross section views of gate regions with randomly distributed high-k materials that enable different $V_{th}$ to be generated.

Referring now to FIG. 1, a structure 100 is shown, in accordance with an embodiment. The structure 100 may include a substrate 102, a buried oxide 104, and a fin 106. The substrate 102 may include one or more semiconductor materials. Non-limiting examples of suitable substrate 102 materials may include Si (silicon), strained Si, Ge (germanium), SiGe (silicon germanium), Si alloys, Ge alloys, III-V materials (e.g., GaAs (gallium arsenide), InAs (indium arsenide), InP (indium phosphide), or Indium Gallium Arsenide (InGaAs), II-VI materials (e.g., CdSe (cadmium selenide), CdS (cadmium sulfide), CdTe (cadmium telluride)), or any combination thereof. In an embodiment, the substrate 102 may include silicon.

The buried oxide 104 is arranged on the substrate 102. The buried oxide 104 may be an oxide layer, such as, for example, silicon oxide, buried in a silicon wafer. The fin 106 is arranged on a top surface of the buried oxide 104. The fin 106 may be made of silicon. In an embodiment, the fin 106 may be a silicon-on-insulator fin. In an alternative embodiment, the fin 106 may be a bulk fin. Further, it should be appreciated that even though a silicon-on-insulator fin is illustrated, embodiments of the present invention may be implemented on any CMOS device or a transistor device that includes a gate structure.

Figure 2:
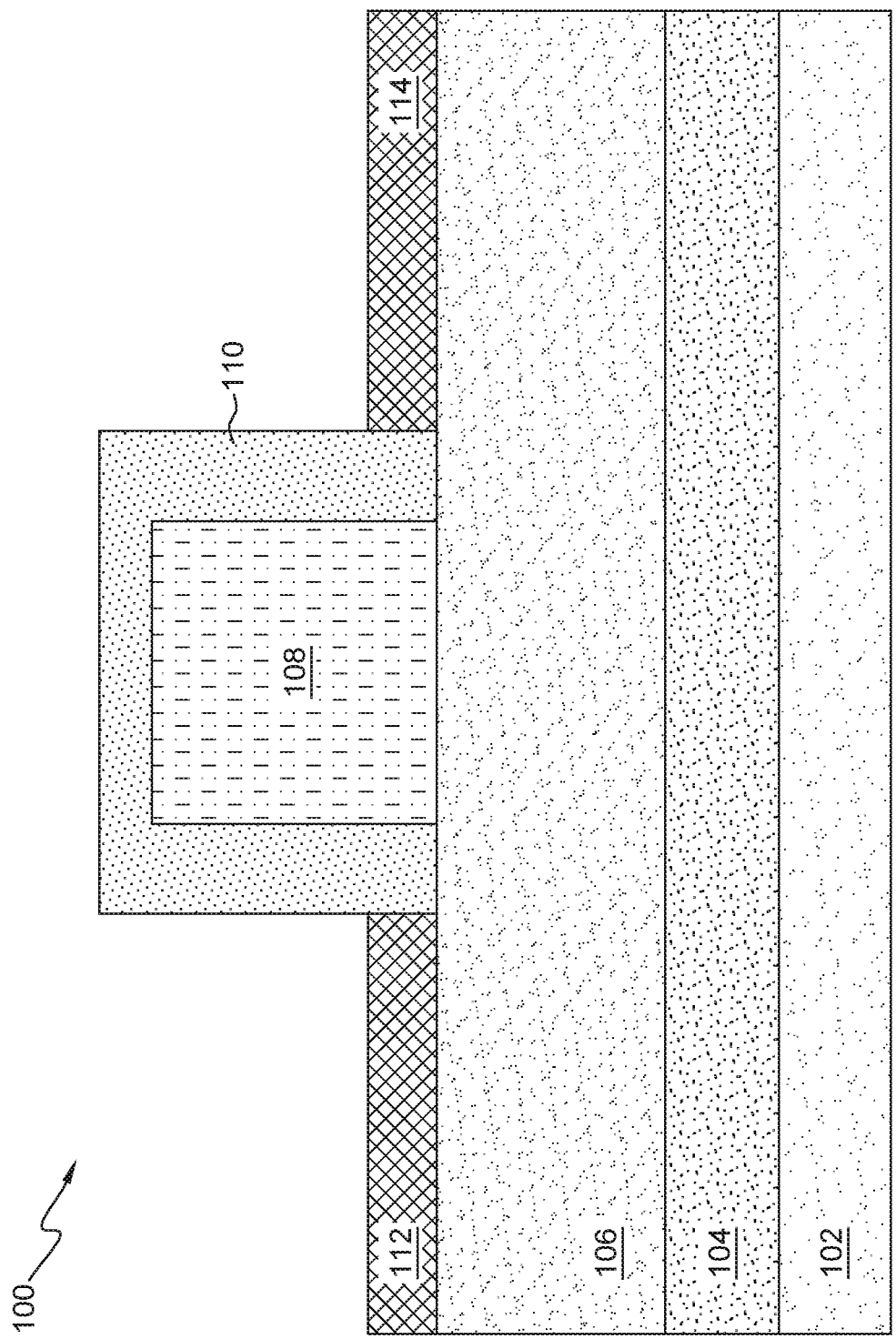
FIG. 2 is a cross section view illustrating a dummy gate and a gate spacer arranged on the fin according to an exemplary embodiment.

Referring now to FIG. 2, the structure 100 with a dummy gate 108, a gate spacer 110, a first source drain 112, and a second source drain 114 is shown, in accordance with an embodiment. A sacrificial gate material may be deposited on the top surface of the fin 106. The sacrificial gate material may then be patterned to form the dummy gate 108.

The dummy gate 108 may be formed from the sacrificial gate material, such as, for example, amorphous silicon (a-Si)

or polycrystalline silicon (polysilicon). The sacrificial material may be deposited by a deposition process, including, but not limited to, physical vapor deposition (PVD), chemical vapor deposition (CVD), plasma enhanced chemical vapor deposition (PECVD), inductively coupled plasma chemical vapor deposition (ICP CVD), or any combination thereof. The sacrificial material forming the dummy gate 108 may have a thickness of about 50 nm to about 250 nm, or from about 100 nm to about 200 nm.

Once the dummy gate 108 is formed, the gate spacer 110 is then conformally deposited on the dummy gate 108. The gate spacer 110 is then patterned to remove portions of the gate spacer 110 that are on the top surface of the fin 106. As a result, the gate spacer 110 surrounds the dummy gate 108. The gate spacer 110 is on the top surface and the sidewalls of the dummy gate 108.

The gate spacer 110 may include an insulating material, such as, for example, silicon dioxide, silicon nitride, SiOCN, or SiBCN. Other non-limiting examples of materials for the gate spacer 110 may include dielectric oxides (e.g., silicon oxide), dielectric nitrides (e.g., silicon nitride), dielectric oxynitrides, or any combination thereof. The gate spacer 110 materials are deposited by a deposition process, for example, chemical vapor deposition (CVD) or physical vapor deposition (PVD). The gate spacer 110 may have a thickness of about 3 to about 15 nm, or of about 5 to about 8 nm. The gate spacer 110 insulates the dummy gate 108 from other materials formed or deposited around the dummy gate 108. Further, the gate spacer 110 separates the dummy gate 108 from the first and second source drains 112, 114.

Once the gate spacer 110 is deposited, an epitaxial layer is grown on the surface of the fin 106 to form the first source drain 112 and the second source drain 114. The first and second source drains 112, 114 may be grown using a suitable growth process, for example, chemical vapor deposition (CVD) (low pressure (LP) or reduced pressure chemical vapor deposition (RPCVD), vapor-phase epitaxy (VPE), molecular-beam epitaxy (MBE), liquid-phase epitaxy (LPE), metal organic chemical vapor deposition (MOCVD), or other suitable processes.

The sources for the epitaxial layer material may be, for example, silicon, germanium, or a combination thereof. The gas source for the deposition of epitaxial semiconductor material may include a silicon-containing gas source, a germanium-containing gas source, or a combination thereof. For example, an epitaxial silicon layer may be deposited from a silicon gas source that is selected from the group consisting of silane, disilane, trisilane, tetrasilane, hexachlorodisilane, tetrachlorosilane, dichlorosilane, trichlorosilane, and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium, and argon can be used.

The first and second source drains 112, 114 may be in-situ doped with a p-type dopant or an n-type dopant. For example, for a p-type FET, the first and second source drains 112, 114 may be made of silicon germanium and in-situ doped with a p-type dopant, such as, for example, boron. For an n-type FET, the first and second source drains 112, 114 may be made of silicon and in-situ doped with an n-type dopant, such as, for example, phosphorus or arsenic.

Figure 3:
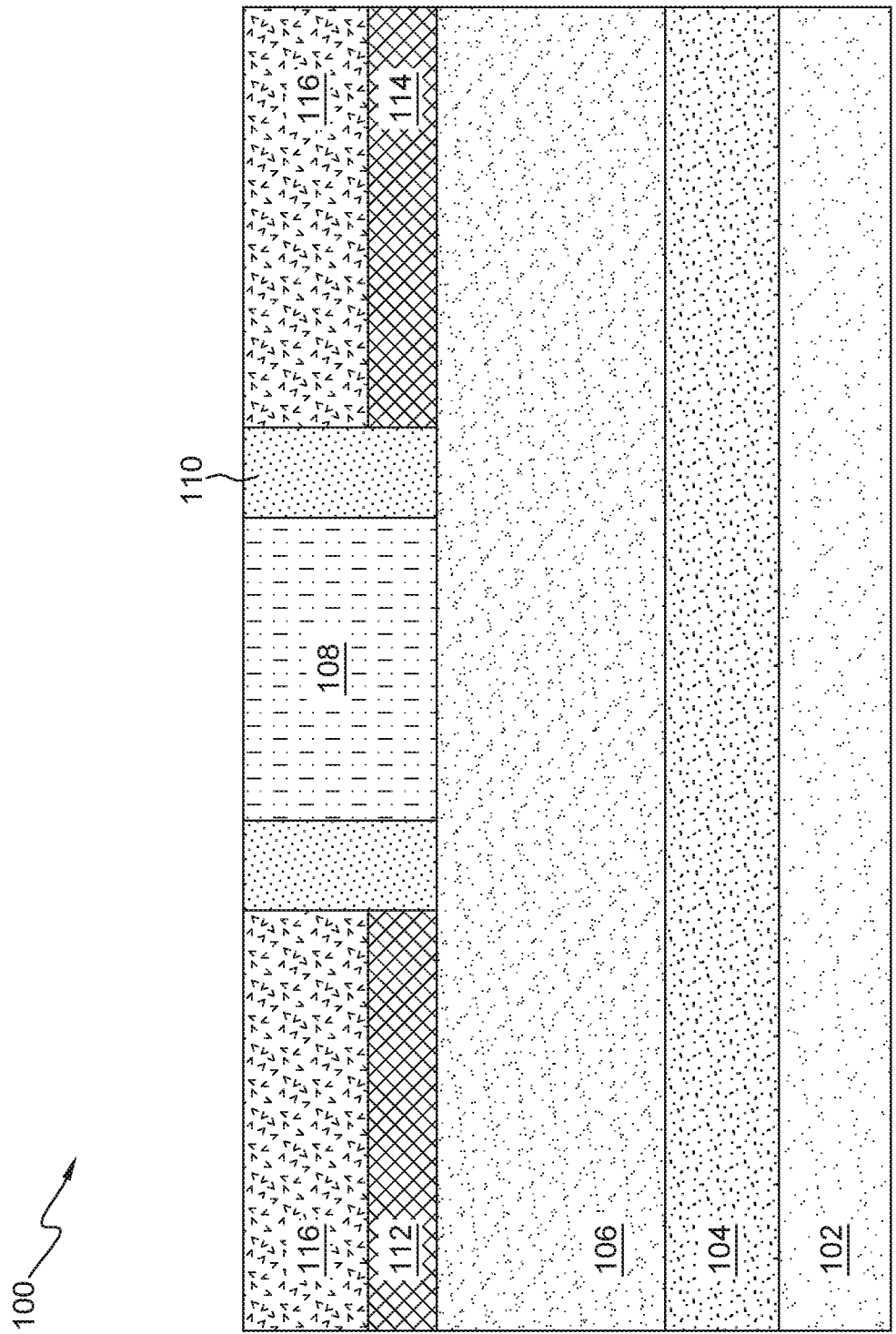
FIG. 3 is a cross section view illustrating a first and second source drains and an interlayer dielectric according to an exemplary embodiment.

Referring now to FIG. 3, the structure 100 with an interlayer dielectric (ILD) 116 is shown, in accordance with an embodiment. Once the first and second source drains 112, 114 are formed, the ILD 116 may be deposited on to the top surfaces of the first and second source drains 112, 114 such that top surface of the ILD 116 is substantially flush with the top surface of the gate spacer 110 (not illustrated). The ILD 116 surrounds the gate spacer 110. The ILD 116 may be formed from, for example, a low-k dielectric material (with k<4.0), including but not limited to, silicon oxide, spin-on-glass, a flowable oxide, a high density plasma oxide, borophosphosilicate glass (BPSG), or any combination thereof.

The ILD 116 is deposited by a deposition process, including, but not limited to CVD, PVD, plasma enhanced CVD, evaporation, chemical solution deposition, or like processes. After the ILD 116 is deposited, a planarization process, such as, for example, a CMP process, may be used to remove excess ILD 116 from the top surface of the structure 100. The CMP process may also be used to remove portions of the gate spacer 110 directly above the dummy gate 108. Removing the gate spacer 110 directly above the dummy gate 108 exposes the top surface of the dummy gate 108 such that the dummy gate 108 may be removed in subsequent process steps.

Figure 4:
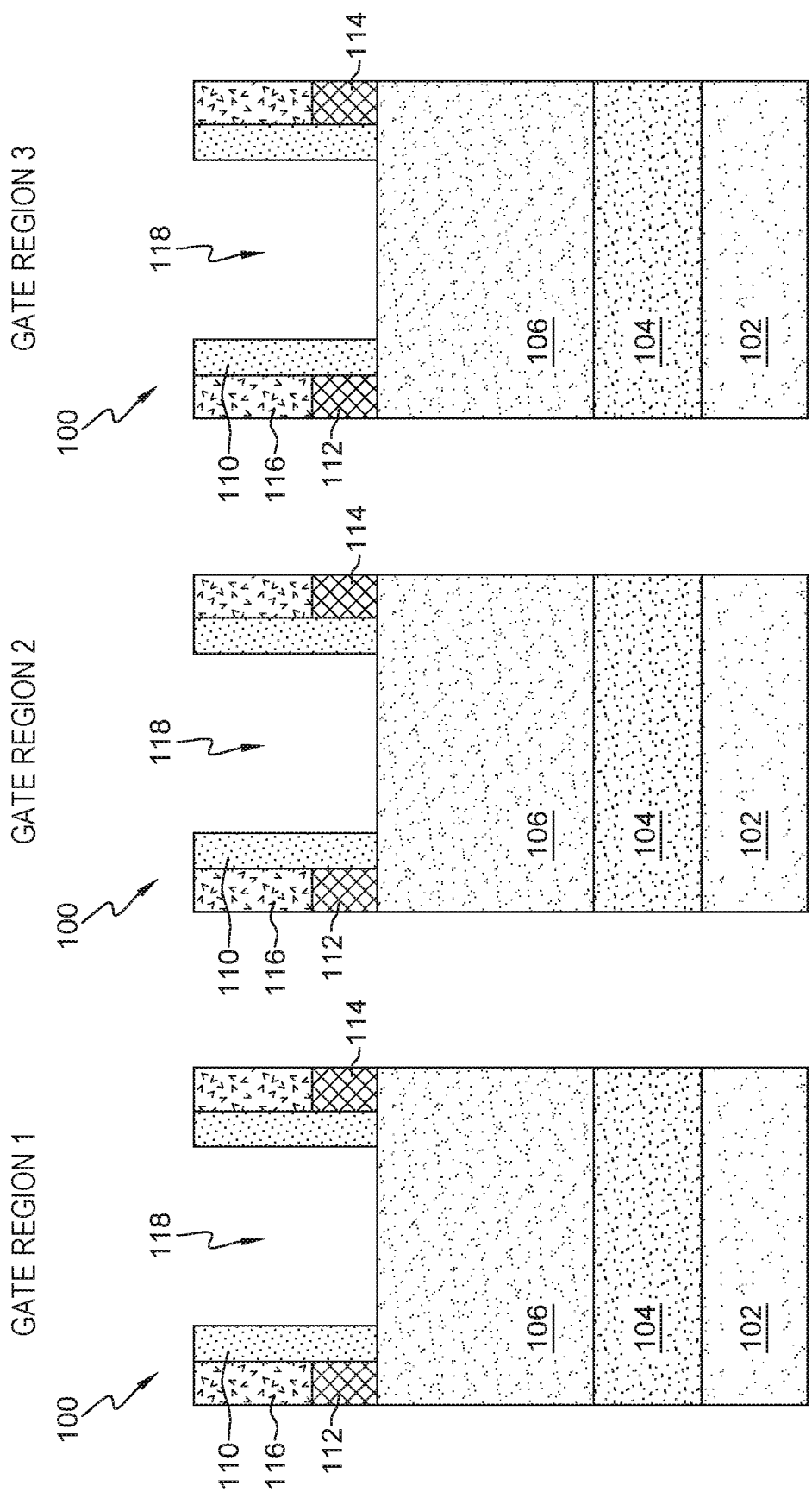
FIG. 4 are cross section views illustrating multiple gate regions with trenches formed to expose top surfaces of the fins according to an exemplary embodiment.

Referring now to FIG. 4, multiple structures 100 with trenches 118 are shown, in accordance with an embodiment. It should be appreciated that even though three structures 100 are illustrated, embodiments of the present invention contemplate forming a plurality of structures 100 on a single substrate wafer. Each structure 100 includes a gate region surrounded by the ILD. FIG. 4 illustrates three gate regions, gate region 1, gate region 2, and gate region 3, for the purpose of illustrating that there are more than one gate region on a silicon wafer since there are more than one structure 100 on the silicon wafer.

An etch process, such as, for example, a wet etch process may be performed to remove the dummy gates 108 from each gate region of the structures 100 until the top surfaces of the fins 106 are exposed, thereby forming the trenches 118. Each trench 118 may extend from the top surface of the gate spacer 110 to the top surface of the fin 106. The etch process removes the dummy gate 108 material selective to the fin 106 material. However, the tech process does not remove the gate spacer 110. As a result, the gate spacer 110 separates the first and the second source drains 112, 114 from the gate region.

Figure 5:
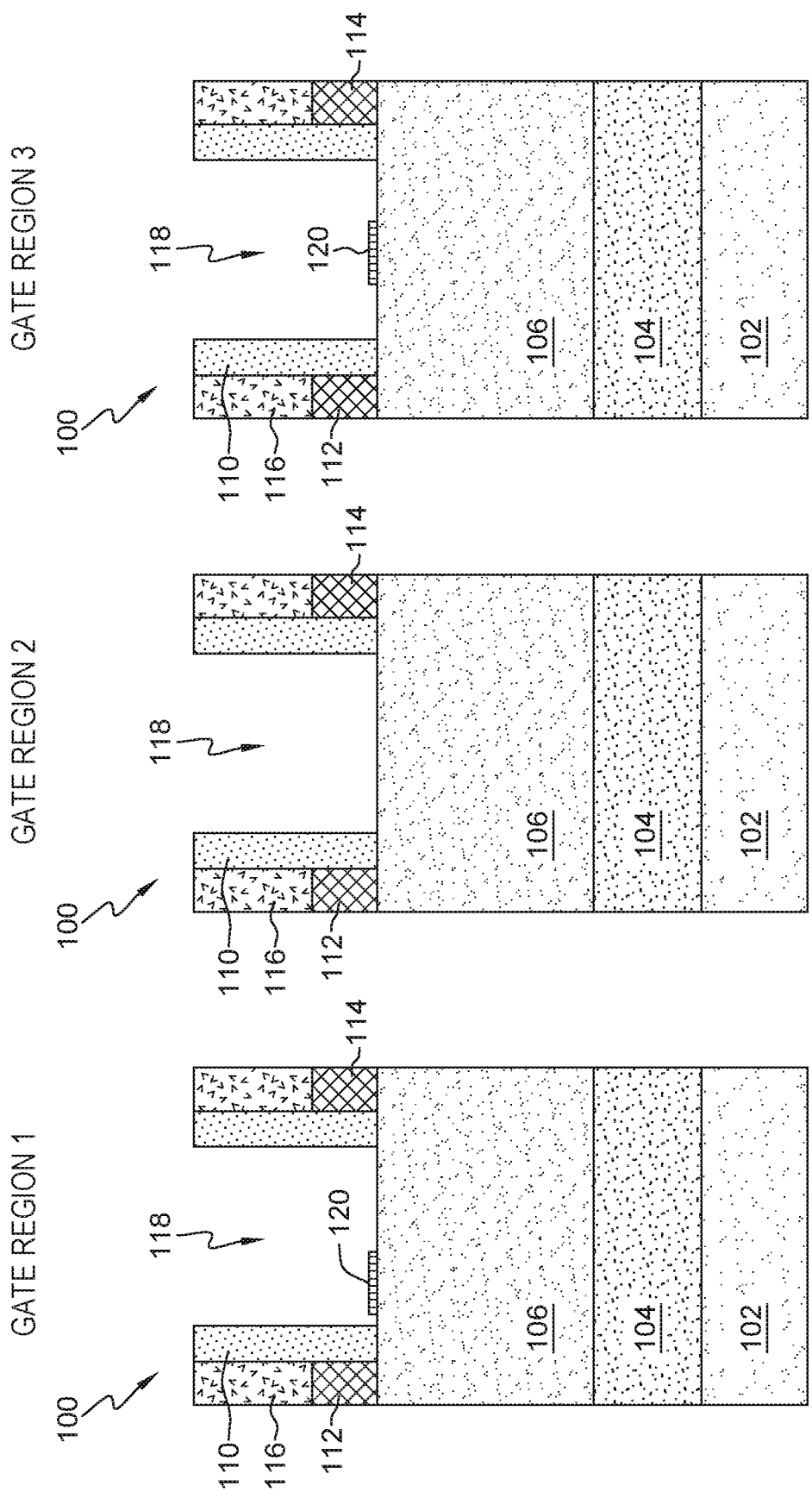
FIG. 5 are cross section views illustrating multiple gate regions with a first high-k material according to an exemplary embodiment.

Referring now to FIG. 5, three gate regions of structures 100 are shown, in accordance with an embodiment. Using a timed atomic layer deposition process, the first high-k material 120 is randomly deposited into the trenches 118 of the structures 100. The first high-k material 120 is deposited onto the surface of the exposed fins 106 (in the gate region). A deposition time very close to the nucleation time is chosen to facilitate random nucleation. Due to said nucleation variation, some of the first high-k material 120 may deposit randomly at some gate regions, such that the first high-k material 120 may partially cover the surface of the exposed fin 106 (in the gate region). As a result, some gate regions may have least a portion of the top surface of the fin 106 remaining exposed after the formation of the first high-k material 120. Further, not all gate regions of structures 100 may have the first high-k material 120. As is illustrated, gate regions 1 and 3 include the first high-k material 120, whereas gate region 2 does not. In addition, the randomness of nucleation cannot be repeated. As a result, conducting another deposition of the first high-k material 120 may not yield the same results with gate regions 1 and 3 including the first high-k material 120. It should be appreciated that a typical substrate wafer may include thousands, even millions, of gate regions. Due to the random nucleation, each substrate wafer may have millions of gate regions with different first high-k material 120 nucleation. As a result, no two wafers will have all of its gate regions identically nucleated with the first high-k material 120.

The first high-k material 120 may be made of material such as aluminum oxide ($Al_2O_3$). Other materials, such as, for example, lutetium oxide ($Lu_2O_3$), yttrium oxide ($Y_2O_3$), magnesium oxide (MgO), and other rare earth oxides, may also be used as the first high-k material 120. The composition, deposition process, and post-deposition treatment of the first high-k material 120 may have a different effect on the threshold voltage ($V_{th}$) of the structure 100, depending on whether the structure 100 is a pFET or an nFET, the electrical properties of the interface between the high-k material 120 and the top surface of the fin 106 (including interfacial oxide formation during or after high-k material deposition), the composition of the gate metal, the polarity of the distributed charges through the high-k dielectric and at the high-k dielectric/fin interface, as well as other device and process parameters well known in the art.

Figure 6:
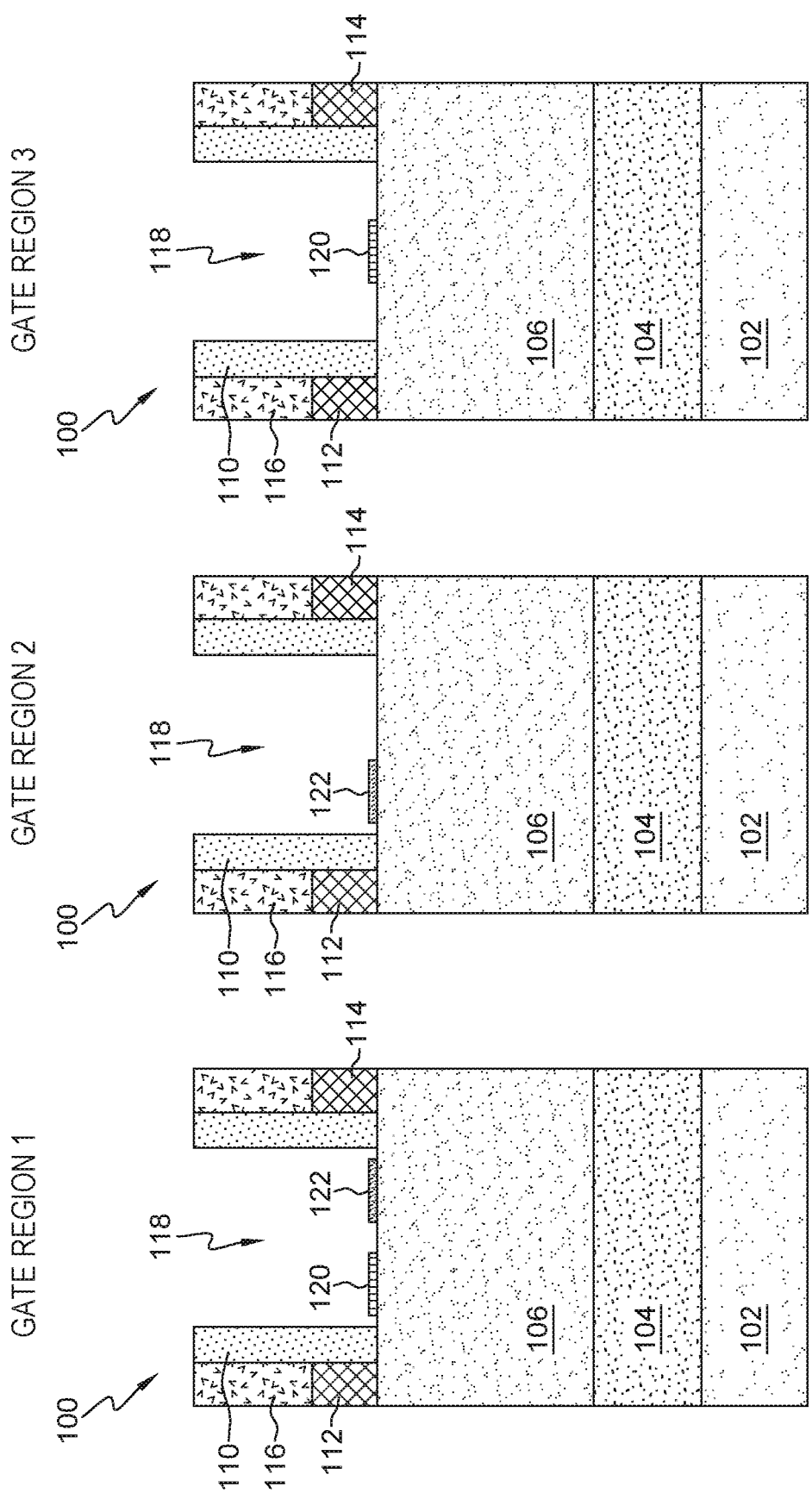
FIG. 6 are cross section views illustrating multiple gate regions with a second high-k material according to an exemplary embodiment.

Referring now to FIG. 6, three gate regions of structures 100 with a second high-k material 122 are shown, in accordance with an embodiment. Using a timed atomic layer deposition process, the second high-k material 122 is deposited into the trenches 118 of the structures 100. The second high-k material 122 is deposited the surface of the exposed fins 106 (in the gate region). Just like the first high-k material 120, the second high-k material 122 may randomly nucleate in different gate regions, thus partially covering the surface of the exposed fins 106 (in the gate region). As a result, some gate regions may have least a portion of the surface of the exposed fin 106 (in the gate region) remaining exposed after the formation of the second high-k material 122. As a result, some gate regions may include both the first high-k material 120 and the second high-k material 122, whereas some gate regions may either have the first high-k material 120 or the second high-k material 122. There may also be gate regions with neither the first high-k material 120 nor the second high-k material 122. As described above with reference to the first high-k material 120, the second high-k material 122 also nucleates randomly within the millions of gate regions on a substrate wafer.

During nucleation, the second high-k material 122 may overlap the first high-k material 120. The second high-k material 122 may also be adjacent to the first high-k material 120. The second high-k material 122 either be in contact with the first high-k material 120 or not contacting the first high-k material 120 even if both the first and second high-k materials 120, 122 are present in the same gate region.

The second high-k material 122 may be made of material such as lanthanum oxide ($La_2O_3$), or other materials, such as, for example, lutetium oxide ($Lu_2O_3$), yttrium oxide ($Y_2O_3$), magnesium oxide (MgO), and other rare earth oxides. Similar to the first high-k material 120, the second high-k material 122 may have a different effect on $V_{th}$, depending on its composition, as well as various other material, device and process parameters as known in the art. For example, the first high-k material 120 may increase the $V_{th}$ while the second high-k material 122 may decrease the $V_{th}$ and vice versa; or they may both increase or decrease the $V_{th}$.

Figure 7:
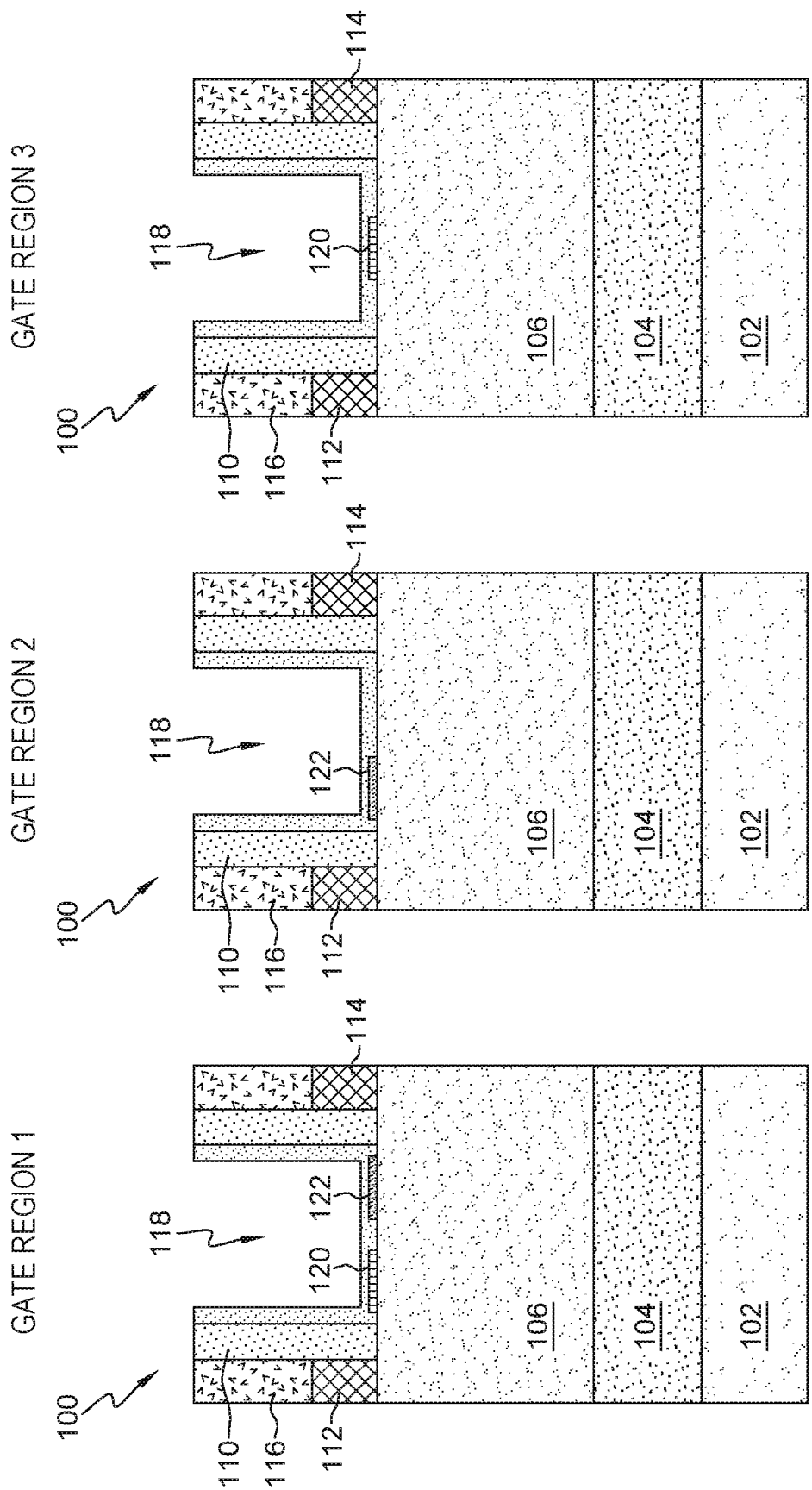
FIG. 7 are cross section views illustrating multiple gate regions with a gate dielectric layer according to an exemplary embodiment.

Referring now to FIG. 7, three gate regions of structures 100 with a gate dielectric layer 124 are shown, in accordance with an embodiment. Using an atomic layer deposition process, the gate dielectric layer 124 is conformally deposited into the trenches 118 of the structures 100, along the bottom and sidewalls of the trenches 118. The gate dielectric layer 124 is deposited into the trenches 118 of all of the open gate regions. The gate dielectric layer 124 is made with high-k dielectric material. Non-limiting examples of suitable materials for the gate dielectric layer 124 include oxides, nitrides, oxynitrides, silicates (e.g., metal silicates), aluminates, titanates, nitrides, or any combination thereof. Examples of high-k materials include, but are not limited to, metal oxides such as hafnium oxide ($HfO_2$). The portion of the fin 106 under the gate dielectric layer 124 may also be referred to as a channel.

Figure 8:
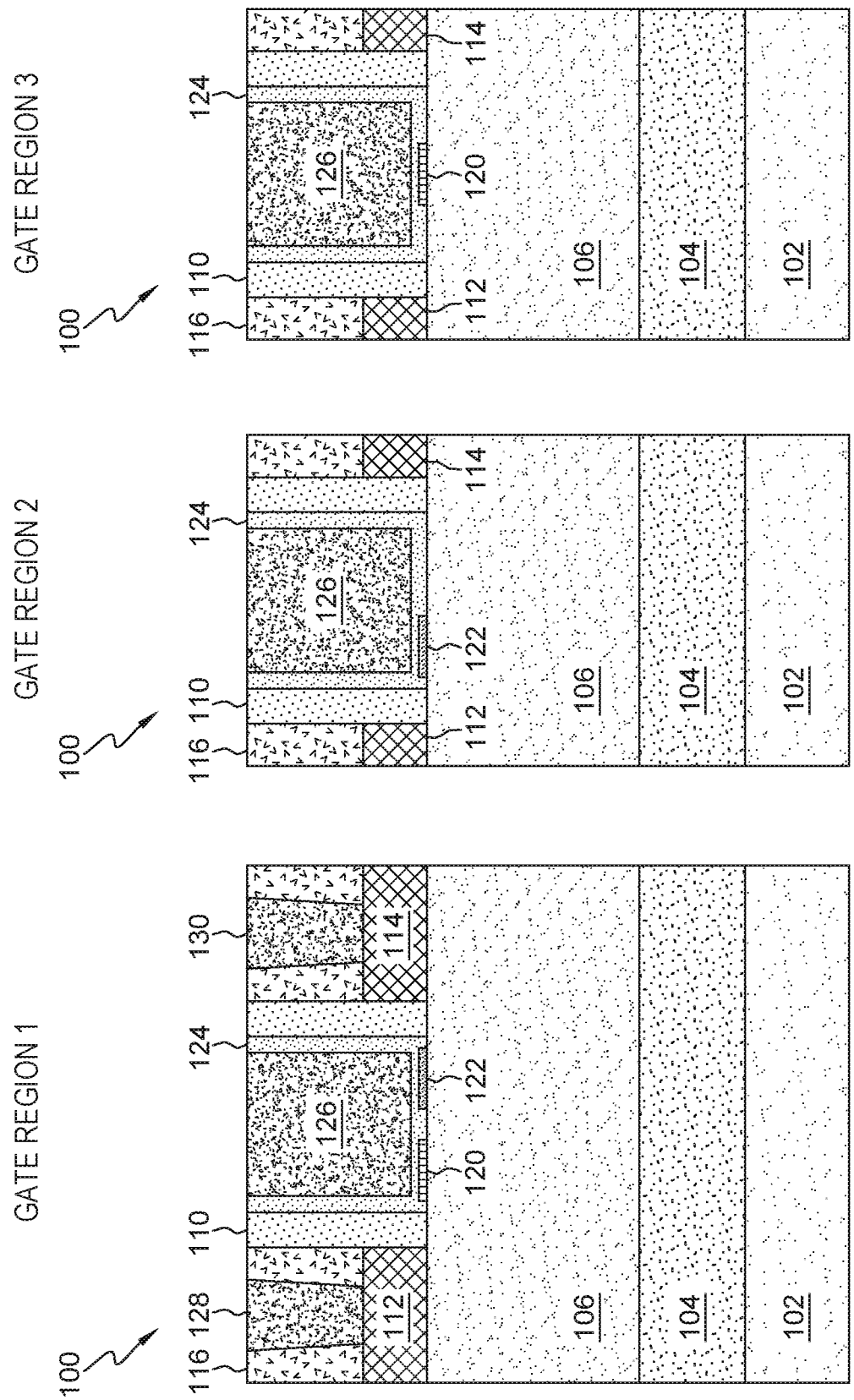
FIG. 8 are cross section views illustrating multiple gate regions with a gate metal and contacts according to an exemplary embodiment.
Figure 9:
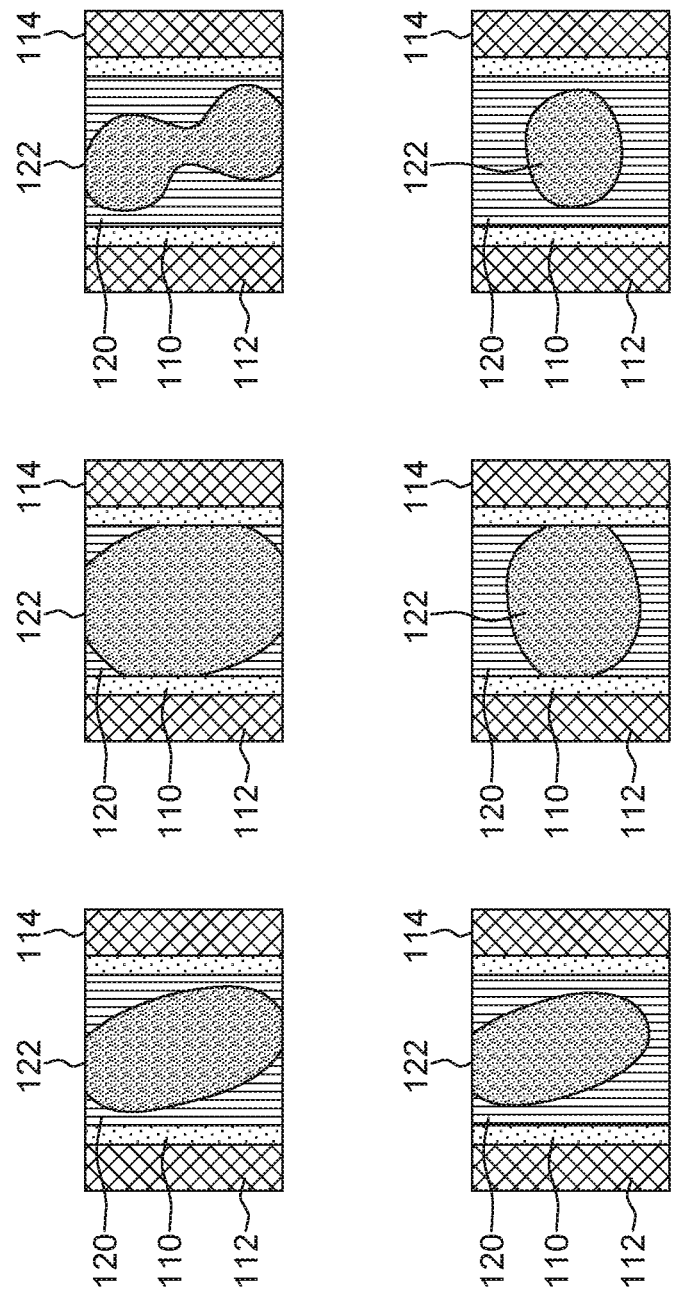
FIG. 9 are top views of gate regions illustrating random nucleation of first and second high-k materials according to an exemplary embodiment.

Referring now to FIG. 8, three gate regions of structures 100 with a metal gate 126 are shown, in accordance with an embodiment. Once the gate dielectric layer 124 is deposited along the sidewalls and bottom of the trenches 118, the trenches 118 are filled with a conductive metal to form the metal gates 126. Non-limiting examples of the conductive material that forms the metal gates 126 may include aluminum (Al), platinum (Pt), gold (Au), tungsten (W), titanium (Ti), or any combination thereof. The conductive metal may be deposited by a suitable deposition process, for example, chemical vapor deposition, plasma-enhanced chemical vapor deposition, physical vapor deposition, plating, thermal or e-beam evaporation, and sputtering.

In addition to the formation of the metal gates 126, the structures 100 also undergo further processing to form contacts, including a first and second source drain contacts 128, 130, illustrated in gate region 1 of FIG. 8. The first and second source drain contacts 128, 130 extend through the ILD 116 to the first and second source drains 112, 114, respectively and are formed within trenches. To remove the ILD 116 and form the contact trenches, a resist, such as a photoresist, may be deposited and patterned. An etch process, such as reactive ion etch, may be performed using the patterned resist as an etch mask to remove the ILD 116 until the first and second top source drains 112, 114 are exposed. The contact trenches are filled with a conductive material or a combination of conductive materials to form the first and second source drain contacts 128, 130. The conductive material filling may be a conductive metal, for example, aluminum (Al), platinum (Pt), gold (Au), tungsten (W), titanium (Ti), or any combination thereof. The conductive material may be deposited by a suitable deposition process, for example, chemical vapor deposition, plasma enhanced chemical vapor deposition, physical vapor deposition, plating, thermal or e-beam evaporation, or sputtering. A planarization process, for example, chemical mechanical planarization, is performed to remove any conductive material from the surface of the ILD 116.

The resultant structures 100, as illustrated in FIG. 8, include gate regions that may contain different combinations of the first and second high-k materials 120, 122. For example, some gate regions may include both the first and second high-k materials 120, 122, as is illustrated in gate region 1. Some gate regions may only include the first high-k material 120, as is illustrated in gate region 2, or the second high-k material 122, as is illustrated in gate region 3. In addition, there may be gate regions, not illustrated, which do not contain either the first high-k material 120 or the second high-k material 122. However, all gate regions include the gate dielectric layer 124. All gate regions may also include the metal gate 126.

Having the first and/or the second high-k materials 120, 122 in certain gate regions of a circuit device produces or facilitates different threshold voltages in these gate regions. The different threshold voltages are accomplished by the use of the first and the second high-k materials 120, 122 that have different chemical compositions, in combination with the gate dielectric layer 124. For example, the first high-k material 120 may be referred to as A, the second high-k material 122 may be referred to as B and the gate dielectric layer 124 may be referred to as C. As described herein above, all gate regions include C. Some gate regions include C only. Some gate regions have a combination of C and A, some gate regions have a combination of C and B, and some gate regions have a combination of C, A, and B, where A and B may be next to each other, or may even overlap. As a result, the different threshold voltages may provide a random set of transistors in a given chip. The randomness is accomplished through the random nucleation of the first and/or the second high-k materials 120, 122 in the gate regions of structures 100. As described above, nucleation within the gate regions is random such that each substrate wafer may have different combination of the first and/or second high k-materials 120, 122. As a result, some gate regions include both the first and the second high-k materials 120, 122, some gate regions include only one of the high-k materials, whereas some gate regions include neither the first nor the second high-k materials 120, 122. In addition, a typical substrate wafer may include millions of gate regions. Due to the randomness of nucleation of the high-k materials, no two substrate wafers will have the same deposition pattern of the first and second high-k materials 120, 122 in each of the gate regions of both wafers. As a result, each gate region of each substrate wafer has a particular threshold voltage. These threshold voltages may be used as PUFs to identify each chip.

Referring now to FIG. 9, top views of gate regions illustrating random nucleation of first and second high-k materials is shown, in accordance with an embodiment. As described herein above, the $V_{th}$ refers to the "effective" or "extrapolated" threshold voltage of the transistor. For example, an effective threshold voltage may refer to the minimum voltage required to turn on a transistor and have current (for example, a measurable or detectable current) flow from the first source drain 112 to the second source drain 114, or vice versa. Having either the first, the second, or both, high k-materials 120, 122 nucleating in the gate regions provides variation in the effective threshold voltage due to the randomness of the nucleation process.

The cross-sections in the top row illustrate the first high-k material 120 and the second high-k material 122 extending from top to bottom. In this exemplary embodiment, the composition of the high-k materials and the device and process parameters are such that the portion of the transistor channel covered by the second high-k material 122 has a "locally" higher threshold voltage than the portion of the transistor channel covered by the first high-k material 120. As a result, the addition of the second high-k material 122 increases the effective threshold voltage of the transistor. This increase in the effective threshold voltage of the transistor is most significant when the second high-k material 122 spans the entire channel width of the transistor as illustrated in the top row. This is because, when a gate voltage of the transistor is lower than the local threshold voltage associated with the channel region covered by the second high-k material 122 but higher than the local threshold voltage associated with the channel region covered by the first high-k material 120, the presence of the second high-k material 122 across the entire channel width effectively blocks current flow between the two source drains 112, 114; whereas in the embodiments illustrated in the bottom row, there still exists a path for current flow between the two source drains 112, 114 through the locally lower threshold voltage region of the channel covered by the first high-k material 120. Therefore, the presence of the second high-k material 122 in the embodiments illustrated in the bottom row may result in a relatively small or negligible increase in the effective threshold voltage compared to the embodiments illustrated in the top row. However, the presence of the second high-k material 122 in the embodiments illustrated in the bottom row can reduce the ON current of the transistor by reducing the effective channel width available for current flow. The presence of the second high-k material 122 in the embodiments illustrated in the top row can also reduce the ON current of the transistor by virtue of increasing the effective threshold voltage of the transistor.

The peripheral circuitry may detect the transistor-to-transistor variability in the effective threshold voltage, the transistor-to-transistor variability in the ON current (for a given gate bias or a range of gate biases), or a combination of both. As stated above, threshold-voltage sensing circuitry are most effective in detecting variations arising from random nucleation in the embodiments shown in the top row of FIG. 9; whereas current sensing circuitry can be effective in detecting variations arising from random nucleation in the embodiments illustrated in both rows. The threshold voltage sensing peripheral circuitry may be based on, for example, switched capacitors, or other circuit configurations known in the art. The current sensing circuitry may be based on, for example, sense amplifiers or other circuit configurations known in the art. Both methods of detecting transistor-to-transistor variability are within the scope of this invention.

Embodiments of the present invention describe using the nucleation effect of atomic layer deposition of high-k materials in the gate regions to form random $V_{th}$ of any field effect transistor structure or other structures that include a gate and a gate dielectric layer. The randomness of nucleation of the first and second high-k materials 120, 122 allows for the $V_{th}$ to be used as a PUF, thus providing chip/wafer identification and authenticity.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor structure comprising:
   one or more metal gates;
   one or more channels below the one or more metal gates;
   a gate dielectric layer separating the one or more metal gates from the one or more channels; and
   a first high-k material and a second high-k material embedded in the gate dielectric layer, wherein the first high-k material, the second high-k material, and the gate dielectric layer are in direct contact with the one or more channels.

2. The semiconductor structure of claim 1, wherein the first high-k material and the second high-k material are configured to provide a threshold voltage variation in the one or more metal gates.

3. The semiconductor structure of claim 1, wherein the first high-k material is made of aluminum oxide and the second high-k material is made of lanthanum oxide.

4. A semiconductor structure comprising:
- one or more gate regions of one or more field effect transistors, the one or more gate regions is above one or more channels;
- a metal gate, the metal gate is separated from the one or more channels by a gate dielectric layer;
- a first high-k material and a second high-k material embedded in the gate dielectric layer, wherein the first high-k material, the second high-k material, and the gate dielectric layer are in direct contact with the one or more channels; and
- an interlayer dielectric, the interlayer dielectric surrounding the one or more gate regions.

5. The semiconductor structure of claim 4, wherein the first high-k material and the second high-k material are configured to provide a threshold voltage variation in the one or more metal gates.

6. The semiconductor structure of claim 4, wherein the first high-k material is made of aluminum oxide and the second high-k material is made of lanthanum oxide.

7. A semiconductor structure comprising:
- one or more metal gates;
- one or more channels below the one or more metal gates;
- a gate dielectric layer separating the one or more metal gates from the one or more channels; and
- a first high-k material and a second high-k material embedded in the gate dielectric layer, wherein the first high-k material, the second high-k material, and the gate dielectric layer are in direct contact with the one or more channels, and wherein the high-k material partially covers a surface of the one or more channels such that at least a portion of the one or more channels remains exposed.

8. The semiconductor structure of claim 7, wherein the first high-k material and the second high-k material are configured to provide a threshold voltage variation in the one or more metal gates.

9. The semiconductor structure of claim 7, wherein the first high-k material is made of aluminum oxide and the second high-k material is made of lanthanum oxide.

* * * * *